United States Patent
Chacon Rojas et al.

(10) Patent No.: US 12,111,372 B2
(45) Date of Patent: Oct. 8, 2024

(54) WIRELESS COIL ADAPTOR FOR A MAGNETIC RESONANCE IMAGING SYSTEM

(71) Applicant: GE Precision Healthcare LLC, Wauwatosa, WI (US)

(72) Inventors: Gustavo Andres Chacon Rojas, Cleveland, OH (US); Mark Giancola, Chesterland, OH (US); Fraser John Laing Robb, Aurora, OH (US); Jana Michelle Vincent, Aurora, OH (US); Clyve Konrad Rosales Follante, Twinsburg, OH (US)

(73) Assignee: GE PRECISION HEALTHCARE LLC, Wauwatosa, WI (US)

( * ) Notice: Subject to any disclaimer, the term of this patent is extended or adjusted under 35 U.S.C. 154(b) by 208 days.

(21) Appl. No.: 17/727,992

(22) Filed: Apr. 25, 2022

(65) Prior Publication Data

US 2023/0341487 A1  Oct. 26, 2023

(51) Int. Cl.
*G01R 33/36* (2006.01)

(52) U.S. Cl.
CPC ............................... *G01R 33/3692* (2013.01)

(58) Field of Classification Search
CPC ................................................ G01R 33/3692
See application file for complete search history.

(56) References Cited

U.S. PATENT DOCUMENTS

| | | | |
|---|---|---|---|
| 7,123,009 B1 | 10/2006 | Scott | |
| 8,049,500 B2* | 11/2011 | Griswold | G01R 33/3692 324/318 |
| 10,001,534 B2* | 6/2018 | Okamoto | G01R 33/3692 |
| 11,079,275 B2 | 8/2021 | Shimura et al. | |
| 2014/0195954 A1* | 7/2014 | Doshi | G01R 33/543 715/771 |
| 2020/0033429 A1* | 1/2020 | Darnell | G01R 33/3692 |

FOREIGN PATENT DOCUMENTS

WO   20171037594 A2   6/2017

OTHER PUBLICATIONS

Aggarwal, Kamal, et al.; "A Millimeter-Wave Digital Link for Wireless MRI", OEEE Trans Med Imaging Feb. 2017; pp. 1-29.
Byron, Kelly, et al.; "An RF-gated wireless power transfer system for wireless MRI receive arrays", Concepts Magn Reson Part B Magn Eng Oct. 2017; pp. 1-32.
Darnell, Dean, et al.; "Integrated radio-frequency/wireless coil design for simultaneous MR image acquisition and wireless communication", Magnetic Resonance in Medicine Aug. 2018; pp. 2176-2183.

(Continued)

*Primary Examiner* — Gregory H Curran
(74) *Attorney, Agent, or Firm* — Fletcher Yoder P.C.

(57) ABSTRACT

A wireless coil adaptor includes a first plug connector configured to be inserted within a receptacle connector of an MRI system, the receptacle connector being configured for receiving a second plug connector of a wired radio frequency (RF) coil. The wireless coil adaptor also includes a wireless communication module configured to wirelessly communicate with a wireless RF coil.

19 Claims, 7 Drawing Sheets

(56) References Cited

OTHER PUBLICATIONS

Byron, Kelly, et al.; "An MRI Compatible RF MEMs Controlled Wireless Power Transfer System", IEEE Trans Microw Theory Tech, May 2019; pp. 1-33.
IP.com, et al.; "Unplugged Coil Advanced Fault Detection", Electronic Publication Aug. 2021; pp. 1-4.
Aggarwal, Kamal, et al.; "A Wireless MRI system using mm-Wave Transmission", downloaded Feb. 2022, pp. 1-3.
Anand, Suma, et al.; "Beat Pilot Tone: Exploiting Preamplifier Intermodulation of UHF/SHF RF for Improved Motion Sensitivity over Pilot Tone Navigators", downloaded Jan. 2022, pp. 1-3.
Cuthbertson, Jonathan, et al.; "An Integrated RAdio-Frequency/Wirelss (iRFW) Coil Design for Wireless Q-Spoiling During MR Imaging" downloaded Jan. 2022; pp. 1-3.
Lu, Jonathan Y., et al.; "Wireless Clock Transfer for MRI Phase Correction", downloaded Feb. 2022; pp. 1-3.
Reber, Jonas, et al.; "Correction of Gradient Induced Clock Phase Modulation for In-Bore Sampling Receivers", downloaded Feb. 2022, pp. 1-3.
Reykowski, Arne, et al.; "High Precision Wireless Clock Recovery for On-Coil MRI Receivers Using Round-Trip Carrier Phase Tracking", downloaded Feb. 2022, pp. 1-3.
Lu, Jonathan Y., et al.; "Clock Transmission Methods for Wireless MRI: A Study on Clock Jitter & Impact on Data Sampling", downloaded Feb. 2022; pp. 1-3.
Scott, Greig, et al.; "Software Synchronization of Independent Receivers by Transmit Phase Tracking", downloaded Feb. 2022; pp. 1-3.
Scott, Greig, et al.; "Pilot Tone Software Synchronization for Wireless MRI Receivers", downloaded Feb. 2022; pp. 1-3.

\* cited by examiner

WIRELESS COIL ADAPTOR FOR A MAGNETIC RESONANCE IMAGING SYSTEM

BACKGROUND

The subject matter disclosed herein relates to medical imaging and, in particular, to a wireless coil adaptor for a magnetic resonance imaging (MRI) system.

Non-invasive imaging technologies allow images of the internal structures or features of a patient/object to be obtained without performing an invasive procedure on the patient/object. In particular, such non-invasive imaging technologies rely on various physical principles (such as the differential transmission of X-rays through a target volume, the reflection of acoustic waves within the volume, the paramagnetic properties of different tissues and materials within the volume, the breakdown of targeted radionuclides within the body, and so forth) to acquire data and to construct images or otherwise represent the observed internal features of the patient/object.

During MRI, when a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment, $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradient fields vary according to the particular localization method being used. The resulting set of received nuclear magnetic resonance (NMR) signals are digitized and processed to reconstruct the image using one of many well-known reconstruction techniques.

Advances in wireless communication (e.g., Wi-Fi) are enabling new products to be created with wireless communication capabilities such as wireless coils. However, many MRI systems are configured to be utilized with wired coils (e.g., receiving coils) that are plugged into the MRI system. Currently, these MRI systems cannot be utilized with the new technology provided by wireless devices. In addition, due to the high cost of MRI systems, upgrading or replacing an MRI system could be cost prohibitive. Further, upgrading or replacing an MRI system could cost valuable time when the MRI system would otherwise be needed.

BRIEF DESCRIPTION

Certain embodiments commensurate in scope with the originally claimed subject matter are summarized below. These embodiments are not intended to limit the scope of the claimed subject matter, but rather these embodiments are intended only to provide a brief summary of possible embodiments. Indeed, the invention may encompass a variety of forms that may be similar to or different from the embodiments set forth below.

In one embodiment, a wireless coil adaptor is provided. The wireless coil adaptor includes a first plug connector configured to be inserted within a receptacle connector of an MRI system, the receptacle connector being configured for receiving a second plug connector of a wired radio frequency (RF) coil. The wireless coil adaptor also includes a wireless communication module configured to wirelessly communicate with a wireless RF coil.

In another embodiment, a method for utilizing a wireless RF coil with an MRI system configured for utilizing a wired RF coil is provided. The method includes coupling a wireless coil adaptor to the MRI system. The method also includes wirelessly linking the wireless coil adaptor to the wireless RF coil. The method further includes wirelessly receiving from the wireless RF coil at the wireless coil adaptor imaging data acquired during an imaging scan. The method still further includes transmitting the imaging data from the wireless coil adaptor to the MRI system.

In a further embodiment, an MRI system is provided. The MRI system includes a wireless RF coil. The MRI system also includes a wireless coil adaptor. The wireless coil adaptor includes a first plug connector configured to be inserted within a receptacle connector of the MRI system, the receptacle connector being configured for receiving a second plug connector of a wired RF coil. The wireless coil adaptor also includes a wireless communication module configured to wirelessly communicate with the wireless RF coil and to receive imaging data from an imaging scan from the wireless RF coil. The wireless coil adaptor is configured to transmit the imaging data to the MRI system.

BRIEF DESCRIPTION OF THE DRAWINGS

These and other features, aspects, and advantages of the present subject matter will become better understood when the following detailed description is read with reference to the accompanying drawings in which like characters represent like parts throughout the drawings, wherein.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present subject matter, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments.

The disclosed embodiments provide a wireless coil adaptor that enables a wireless coil (e.g., wireless RF receiving coil) to be utilized with an MRI system configured to utilize a wired coil. In particular, the wireless coil adaptor includes a plug connector configured to be inserted within a receptacle connector (e.g., to form mating connectors) utilized for receiving a plug connector of a wired RF coil. The wireless coil adaptor is configured to wirelessly communicate (e.g., via a wireless communication module) with the wireless coil and to act as a gateway between the wireless coil and the MRI system. In addition, the wireless coil adaptor is configured to receive imaging data (e.g., in a digitized form) and to transmit the imaging data (e.g., in an analog form) to the MRI system. In certain embodiments, the wireless coil adaptor includes a synchronization module to synchronize the wireless coil with both the wireless coil adaptor and the MRI system. The wireless coil adaptor is configured to provide or transmit one or more control signals to the wireless coil to control operation (e.g., activation, decoupling, switching, etc.) of the wireless coil. The wireless coil adaptor enables MRI systems configured for wired coils to be utilized with wireless coils without having to upgrade or replace the MRI systems, which avoids high costs and delays. In addition, due to a lack cables coupled to a coil, the setup time during an imaging scan is reduced. Further, the lack of cables coupled to a coil provides additional flexibility in positioning the coil about the patient. Even further, the lack of cables avoids the risk of RF heating on the cables.

Figure 1:
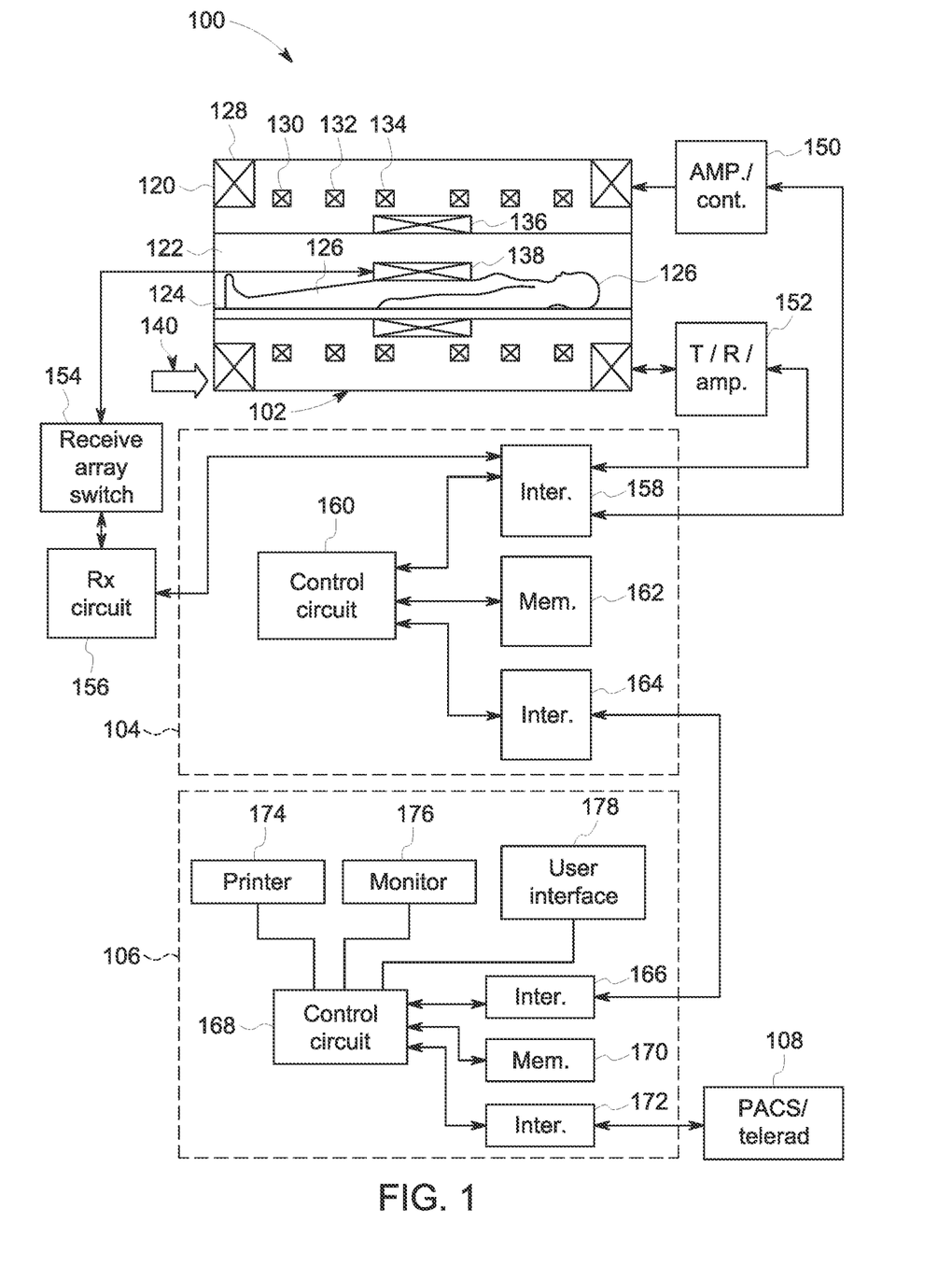
FIG. 1 illustrates an embodiment of an MRI system suitable for use with the disclosed technique.

With the preceding in mind, FIG. 1 an (MRI) system 100 is illustrated schematically as including a scanner 102, scanner control circuitry 104, and system control circuitry 106. According to the embodiments described herein, the MRI system 100 is generally configured to perform MR imaging.

System 100 additionally includes remote access and storage systems or devices such as picture archiving and communication systems (PACS) 108, or other devices such as teleradiology equipment so that data acquired by the system 100 may be accessed on-or off-site. In this way, MR data may be acquired, followed by on- or off-site processing and evaluation. While the MRI system 100 may include any suitable scanner or detector, in the illustrated embodiment, the system 100 includes a full body scanner 102 having a housing 120 through which a bore 122 is formed. A table 124 is moveable into the bore 122 to permit a patient 126 to be positioned therein for imaging selected anatomy within the patient.

Scanner 102 includes a series of associated coils for producing controlled magnetic fields for exciting the gyromagnetic material within the anatomy of the subject being imaged. Specifically, a primary magnet coil 128 is provided for generating a primary magnetic field, $B_0$, which is generally aligned with the bore 122. A series of gradient coils 130, 132, and 134 permit controlled magnetic gradient fields to be generated for positional encoding of certain of the gyromagnetic nuclei within the patient 126 during examination sequences. A radio frequency (RF) coil 136 (e.g., RF transmit coil) is configured to generate radio frequency pulses for exciting the certain gyromagnetic nuclei within the patient. In addition to the coils that may be local to the scanner 102, the system 100 also includes a set of receiving coils or RF receiving coils 138 (e.g., an array of coils) configured for placement proximal (e.g., against) to the patient 126. As an example, the receiving coils 138 can include cervical/thoracic/lumbar (CTL) coils, head coils, single-sided spine coils, and so forth. In certain embodiments, the RF receiving coils 138 may be wireless coils that are configured to be coupled to the MRI system via a wireless coil adaptor. Generally, the receiving coils 138 are placed close to or on top of the patient 126 so as to receive the weak RF signals (weak relative to the transmitted pulses generated by the scanner coils) that are generated by certain of the gyromagnetic nuclei within the patient 126 as they return to their relaxed state.

The various coils of system 100 are controlled by external circuitry to generate the desired field and pulses, and to read emissions from the gyromagnetic material in a controlled manner. In the illustrated embodiment, a main power supply 140 provides power to the primary field coil 128 to generate the primary magnetic field, Bo. A power input 44 (e.g., power from a utility or grid), a power distribution unit (PDU), a power supply (PS), and a driver circuit 150 may together provide power to pulse the gradient field coils 130, 132, and 134. The driver circuit 150 may include amplification and control circuitry for supplying current to the coils as defined by digitized pulse sequences output by the scanner control circuit 104.

Another control circuit 152 is provided for regulating operation of the RF coil 136. Circuit 152 includes a switching device for alternating between the active and inactive modes of operation, wherein the RF coil 136 transmits and does not transmit signals, respectively. Circuit 152 also includes amplification circuitry configured to generate the RF pulses. Similarly, the receiving coils 138 are connected to switch 154, which is capable of switching the receiving coils 138 between receiving and non-receiving modes. Thus, the receiving coils 138 resonate with the RF signals produced by relaxing gyromagnetic nuclei from within the patient 126 while in the receiving mode, and they do not resonate with RF energy from the transmitting coils (i.e., coil 136) so as to prevent undesirable operation while in the non-receiving mode. Additionally, a receiving circuit 156 is configured to receive the data detected by the receiving coils 138 and may include one or more multiplexing and/or amplification circuits.

It should be noted that while the scanner 102 and the control/amplification circuitry described above are illustrated as being coupled by a single line, many such lines may be present in an actual instantiation. For example, separate lines may be used for control, data communication, power transmission, and so on. Further, suitable hardware may be disposed along each type of line for the proper handling of the data and current/voltage. Indeed, various filters, digitizers, and processors may be disposed between the scanner and either or both of the scanner and system control circuitry 104, 106.

As illustrated, scanner control circuit 104 includes an interface circuit 158, which outputs signals for driving the gradient field coils and the RF coil and for receiving the data representative of the magnetic resonance signals produced in examination sequences. The interface circuit 158 is coupled to a control and analysis circuit 160. The control and analysis circuit 160 executes the commands for driving the circuit 150 and circuit 152 based on defined protocols selected via system control circuit 106.

Control and analysis circuit 160 also serves to receive the magnetic resonance signals and performs subsequent processing before transmitting the data to system control circuit 106. Scanner control circuit 104 also includes one or more memory circuits 162, which store configuration parameters, pulse sequence descriptions, examination results, and so forth, during operation.

Interface circuit 164 is coupled to the control and analysis circuit 160 for exchanging data between scanner control circuit 104 and system control circuit 106. In certain embodiments, the control and analysis circuit 160, while illustrated as a single unit, may include one or more hardware devices. The system control circuit 106 includes an interface circuit 166, which receives data from the scanner control circuit 104 and transmits data and commands back to the scanner control circuit 104. The control and analysis circuit 168 may include a CPU in a multi-purpose or application specific computer or workstation. Control and analysis circuit 168 is coupled to a memory circuit 170 to store programming code for operation of the MRI system 100 and to store the processed image data for later reconstruction, display and transmission. The programming code may execute one or more algorithms that, when executed by a processor, are configured to perform reconstruction of acquired data. In certain embodiments, image reconstruction may occur on a separate computing device having processing circuitry and memory circuitry.

An additional interface circuit 172 may be provided for exchanging image data, configuration parameters, and so forth with external system components such as remote access and storage devices 108. Finally, the system control and analysis circuit 168 may be communicatively coupled to various peripheral devices for facilitating operator interface and for producing hard copies of the reconstructed images. In the illustrated embodiment, these peripherals include a printer 174, a monitor 176, and user interface 178 including devices such as a keyboard, a mouse, a touchscreen (e.g., integrated with the monitor 176), and so forth.

Figure 2:
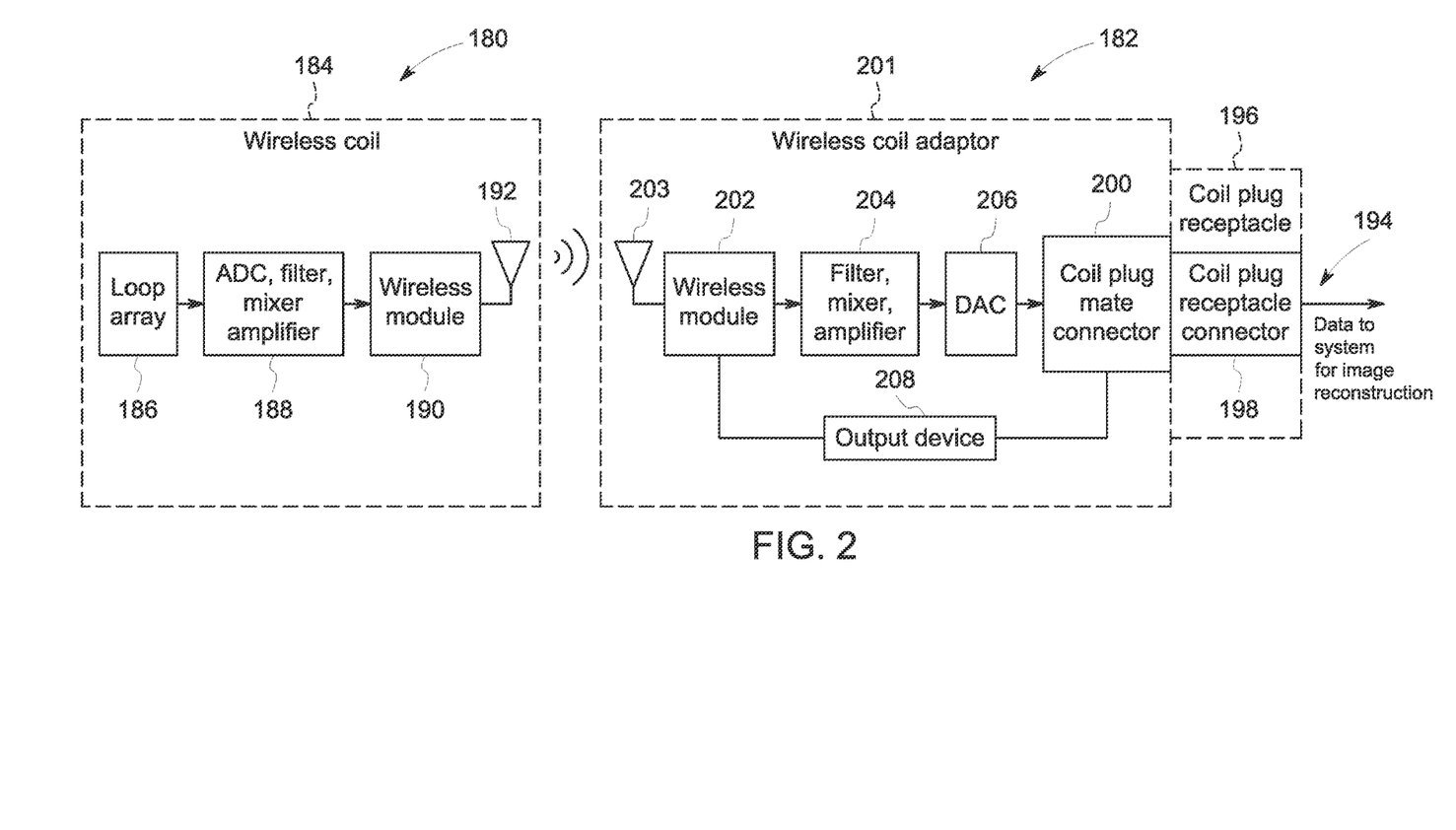
FIG. 2 is a schematic diagram of a wireless coil and a wireless coil adaptor, in accordance with aspects of the present disclosure.

FIG. 2 is a schematic diagram of a wireless coil 180 and a wireless coil adaptor 182. The wireless coil 180 and the wireless coil adaptor 182 are configured to wirelessly communicate with each other utilizing a wireless communication protocol (e.g., Wi-Fi). The wireless coil adaptor 182 acts as a gateway between the wireless coil 180 and the MRI system (e.g., MRI system 100 in FIG. 1). The wireless coil 180 may be an RF receiving coil (e.g., receiving coil 138 in FIG. 1). As depicted, the wireless coil 180 includes an enclosure 184 and a loop array 186 disposed within the enclosure 184. The loop array 186 includes multiple loops (e.g., channels or elements). In certain embodiments, the wireless coil 180 may include multiple loop arrays 186.

The wireless coil 180 also includes a variety of electronics 188 (e.g., electronic circuits) coupled to the loop array 186 and disposed within the enclosure 184. The electronics 188 are utilized in processing the signals detected by the loop array 186. In particular, the electronics 188 are configured to convert the signals (e.g., representing the image data) from an analog format to a digital format. In addition, the electronics 188 are configured to prepare the signals for wireless transmission to the wireless coil adaptor 182. The electronics 188 may include an analog to digital converter, one or more filters, a mixer (e.g., a frequency mixer such as an RF mixer), an amplifier or preamplifier, and/or other electronics. The analog to digital converter may covert the analog signals from the loop array 186 to digital signals. The filters may remove noise from external sources from the signals. The preamplifer increases the amplitude of the received signal from the loop array 186 to a level that can be digitized. The mixer alters the frequency of the electromagnetic signal while preserving other characteristics (e.g., phase and amplitude) of the signal.

The wireless coil 180 further includes a wireless communication module 190 coupled to the electronics 188 and disposed within the enclosure 184. The wireless communication module 190 is coupled to antenna 192. The wireless communication module 190 and the antenna 192 are configured to wirelessly receive signals (e.g. control signals) from the wireless coil adaptor 182 and to transmit signals (e.g., signals representing image data) to the wireless coil adaptor 182.

The wireless coil adaptor 182 is configured to couple to a coil plug receptacle 194 of the MRI system. The coil plug receptacle 194 includes a housing 196 that includes a coil plug receptacle connecter 198. The coil plug receptacle 194 (and the coil plug receptacle connector 198) are configured for receiving and coupling to a plug connector of a wired coil (e.g., wired RF coil). The wireless coil adaptor 182 includes a plug connector 200 (e.g., coil plug mate connector) that is configured to be inserted within the coil plug receptacle connector 198 of the coil plug receptacle 194. The plug connector 200 forms mating connectors with the coil plug receptacle connector 198. The wireless coil adaptor 182 includes a housing 201. A portion of the plug connector 200 may extend from the housing 201 to be inserted within the coil plug receptacle connector 198.

The wireless coil adaptor 182 includes a wireless communication module 202 disposed within the housing 201. The wireless communication module 202 is coupled to an antenna 203. The wireless communication module 202 and the antenna 203 are configured to wirelessly transmit signals (e.g. control signals) to the wireless coil 180 and to receive signals (e.g., signals representing image data) from the wireless coil 180. The controls signals transmitted by the wireless coil adaptor 182 are received from the MRI system via the mating connection between the wireless coil adaptor 182 and the coil plug receptacle 194.

The wireless coil adaptor 182 includes a variety of electronics 204 (e.g., electronic circuits) coupled to the wireless communication module 202. The electronics are disposed within the housing 201. The wireless coil adaptor 182 also includes a digital to analog converter 206. The RF electronics 204 and the digital analog converter 206 are utilized in processing the signals received from the wireless coil 180. In addition, the electronics 204 and the digital to analog converter 206 are configured to prepare the signals for processing by the MRI system for generating reconstructed images. The electronics 204 may include one or more filters, a mixer (e.g., a frequency mixer such as an RF mixer), an amplifier or preamplifier, and/or other electronics. The digital to analog converter 206 is configured to convert the signals (e.g., representing the image data) from a digital format to an analog format.

The configuration of the loop array 186 and the electronics 188 may vary depending on the type of wireless coil 180 and how the wireless coil 180 is activated and controlled. For example, certain wireless coils 180 may utilize multi-control bias (MC Bias) or diode decoupling control in conjunction with a digital signal for controlling switching. In certain embodiments, wireless coils 180 may be actively active (e.g., via an LD diode base circuit activated via a control signal). In certain embodiments, wireless coils may be activated passively (e.g., via LC diode base circuit activated via high power from the system). In certain embodiments, micro-electromechanical systems (MEMS) may be utilized to activate decoupling (e.g., via switching relays). In certain embodiments, gallium arsenide field-effect transistor technology may be utilized in decoupling (e.g. decoupling through using transistor as short or open). In any arrangement of the wireless coil 180, any of these techniques may be implemented via a control signal from the wireless coil adaptor 182 as opposed to power transmitted from the wireless coil adaptor 182. In particular, the wireless coil adaptor 182 is configured to transmit one or more control signals received from the MRI system to the wireless coil 180 to activate the wireless coil 180, to control decoupling of the wireless coil, and/or to control an operation of the wireless coil 180.

Prior to providing control signals to the wireless coil 180 or receiving data from the wireless coil 180, the wireless coil adaptor 182 needs to detect the wireless coil 180. In certain embodiments, received signal strength algorithms such as used in current wireless communication systems or other algorithms may be utilized. In certain embodiments, a beeping signal transmitted by the wireless coil 180 may be utilized. In certain embodiments, detection may occur automatically upon the wireless coil adaptor 182 being coupled to the coil plug receptacle 194. In certain embodiments, detection may occur upon the wireless coil adaptor 182 receiving a control signal from the MRI system.

Upon detection of the wireless coil 180 by the wireless coil adaptor 182, the wireless coil 180 and the wireless coil adaptor 182 are linked. In certain embodiments, the wireless coil adaptor 182 includes an output device 208 for providing a user-perceptible indication of the connection or linkage between the wireless coil adaptor 182 and the wireless coil 180 as described in greater detail below. The output device 208 may include a light emitting device (e.g., a light emitting diode), a display, and/or a speaker. The output device 208 may also be utilized to provide a user-perceptible indication of the connection between the wireless coil adaptor 182 and the coil plug receptacle 194.

Figure 3:
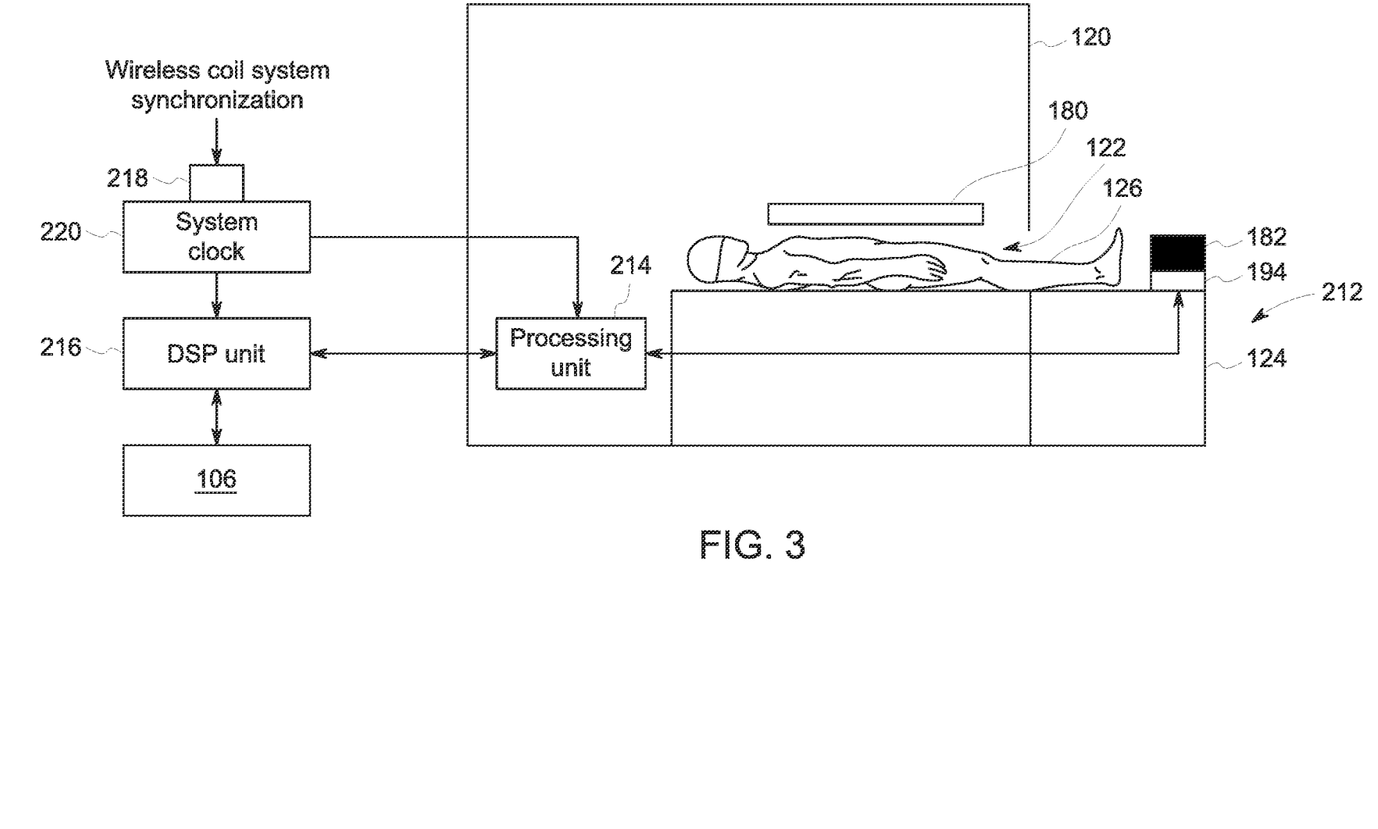
FIG. 3 is a schematic diagram of an MRI system with the wireless coil and the wireless coil adaptor of FIG. 2, in accordance with aspects of the present disclosure.

FIG. 3 is a schematic diagram of an MRI system 210 with the wireless coil 180 and the wireless coil adaptor 182 of FIG. 2. Not all components of the MRI system 210 are shown in FIG. 3. The MRI system 210 is similar to the MRI system 100 in FIG. 1. As depicted, the patient 126 is disposed on the table 124 within the bore 126 of the housing 120 of the MRI system 210. The wireless coil 180 (e.g., RF receiving coil) is placed proximate to the patient 126. The wireless coil adaptor 182 is coupled to (e.g., plugged into) the coil plug receptacle 194. As noted above, the coil plug receptacle 194 is configured to receive the plug connector of a wired RF coil. As depicted, the coil plug receptacle 194 is disposed on an end 212 of the table 124. In certain embodiments, the coil plug receptacle 194 is disposed on an opposite end of the table 124 or at a different location of the table (e.g., along a side between the ends of the table 124). In certain embodiments, the coil plug receptacle 194 is not located on the table but at a location adjacent the table 124.

The coil plug receptacle 194 is coupled to a processing unit 214. The processing unit 214 may be part of a control and analysis circuit (e.g., the control and analysis circuit 160 in FIG. 1) or scanner control circuitry (e.g., scanner control circuitry 104 in FIG. 1). The processing unit 214 may receive the signals representing the image data from the coil plug receptacle 194 via the wireless coil adaptor 182 (which received the signals from the wireless coil 180). The processing unit 214 may provide control signals to the coil plug receptacle 194 which are provided to wireless coil adaptor 182 and then transmitted to the wireless coil 180. These control signals may activate the wireless coil 180, control decoupling of the wireless coil, and/or control an operation of the wireless coil 180.

The processing unit 214 is coupled to a digital signal processor (DSP) unit 216. The DSP unit 216 may be coupled to the system control circuitry 106. The DSP unit 216 may receive the control signals from the system control circuitry 106 and provide them to the processing unit 214. The DSP unit 216 may also receive the signals having the imaging data from the processing unit 214. The processing unit 214 and/or the DSP unit 216 may process the received signals from the coil plug receptacle 194 to reconstruct images. In certain embodiments, the processing unit 214 and the DSP unit 216 may be a single component. The processing unit 214 and the DSP unit 216 may each include a memory and a processor. The processor may include multiple microprocessors, one or more "general-purpose" microprocessors, one or more special-purpose microprocessors, and/or one or more application specific integrated circuits (ASICS), system-on-chip (SoC) device, or some other processor configuration. For example, the processor may include one or more reduced instruction set (RISC) processors or complex instruction set (CISC) processors. The processor may execute instructions to carry out the operation of the MRI system 210. These instructions may be encoded in programs or code stored in a tangible non-transitory computer-readable medium (e.g., an optical disc, solid state device, chip, firmware, etc.) such as the memory.

The MRI system 210 needs to be synchronized with the wireless coil 180. As depicted, an additional adaptor 218 (e.g., synchronization adaptor or synchronization module) is coupled to a system clock 220 (e.g., high-level system clock). The additional adaptor 218 may include a wireless communication module to communicate timing signals to the wireless coil 180. The timing signals are communicated to the wireless coil adaptor 182 via the processing unit 214 and/or the DSP unit 216 and the coil plug receptacle 194. During the scan, the wireless coil 180 could move due to natural movements of the patient 126 (e.g., due to breathing), thus, affecting the synchronization algorithm. Certain techniques (e.g., utilizing pilot tones) may be utilized to accurately synchronize the wireless coil adaptor 182 with the wireless coil 180 by compensating the clock between the wireless coil adaptor 182 and the wireless coil 180.

Figure 4:
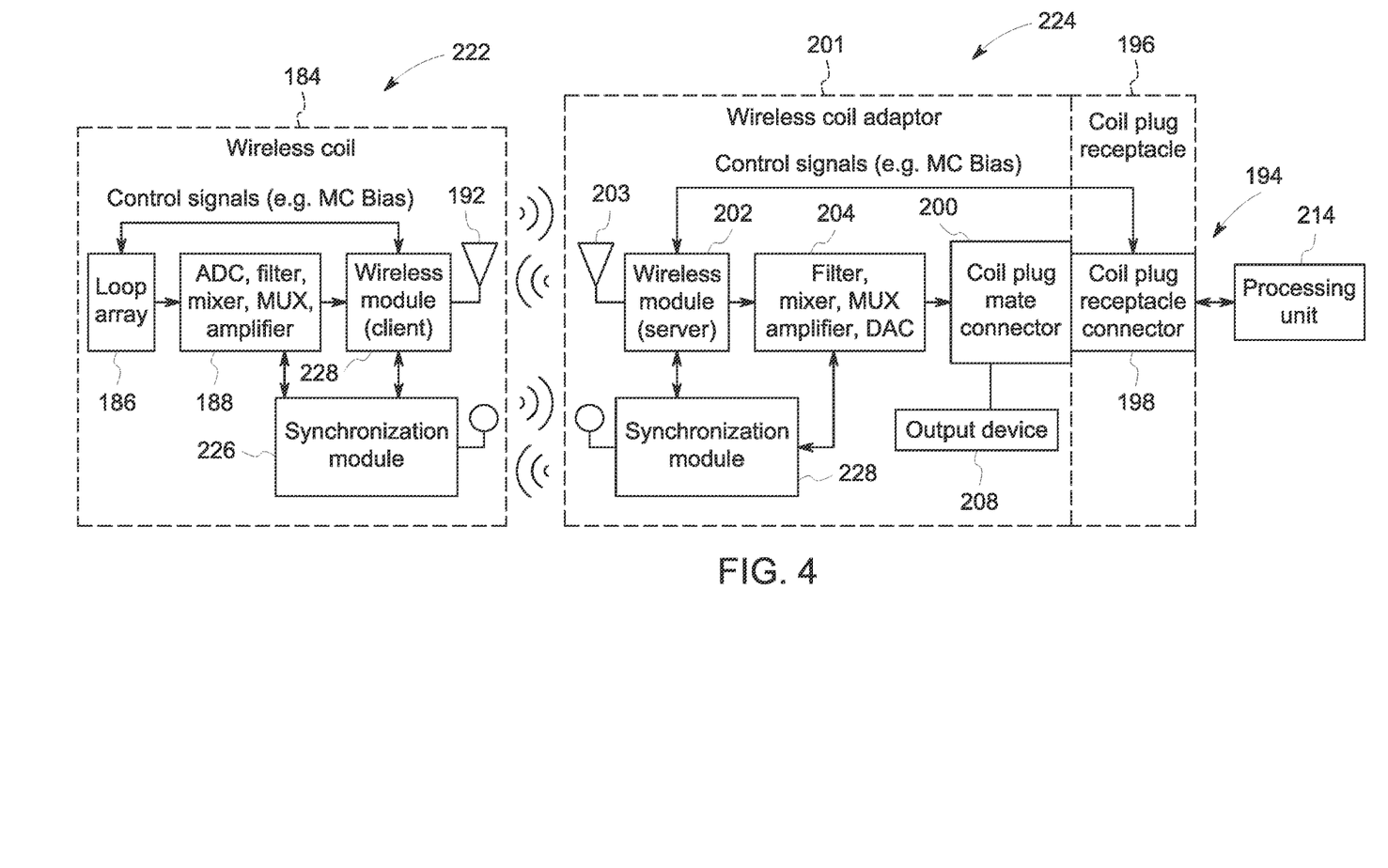
FIG. 4 is a schematic diagram of a wireless coil and a wireless coil adaptor (e.g., having synchronization modules), in accordance with aspects of the present disclosure.

FIG. 4 is a schematic diagram of a wireless coil 222 and a wireless coil adaptor 224 (e.g., having synchronization modules). The wireless coil 222 and the wireless coil adaptor 224 are configured to wirelessly communicate with each other utilizing a wireless communication protocol (e.g., Wi-Fi). The wireless coil adaptor 224 acts as a gateway between the wireless coil 222 and the MRI system (e.g., MRI system 100 in FIG. 1). The wireless coil 222 may be an RF receiving coil (e.g., receiving coil 138 in FIG. 1). As depicted, the wireless coil 222 includes an enclosure 184 and a loop array 186 disposed within the enclosure 184. The loop array 186 includes multiple loops (e.g., channels or elements). In certain embodiments, the wireless coil 222 may include multiple loop arrays 186.

The wireless coil 222 also includes a variety of electronics 188 (e.g., electronic circuits) coupled to the loop array 186 and disposed within the enclosure 184. The electronics 188 are utilized in processing the signals detected by the loop array 186. In particular, the electronics 188 are configured to convert the signals (e.g., representing the image data) from an analog format to a digital format. In addition, the electronics 188 are configured to prepare the signals for wireless transmission to the wireless coil adaptor 224. The electronics 188 may include an analog to digital converter, one or more filters, a mixer (e.g., a frequency mixer such as an RF mixer), an amplifier or preamplifier, and/or other electronics. The electronics 188 may also include a multiplexer (MUX) circuit. The multiplexer circuit may switch multiple input lines to a single common output line. This enables a multiplexed signal to be transmitted wirelessly to the wireless coil adaptor 224. Multiplexing may occur in the frequency domain or the time domain. For frequency multiplexing, one of several bands may be utilized (e.g., 5G, ultra-wideband, and others). The analog to digital converter may covert the analog signals from the loop array 186 to digital signals. The filters may remove noise from external sources from the signals. The preamplifer increases the amplitude of the received signal from the loop array 186 to a level that can be digitized. The mixer alters the frequency of the electromagnetic signal while preserving other characteristics (e.g., phase and amplitude) of the signal.

The wireless coil 222 further includes a wireless communication module 190 coupled to the electronics 188 and disposed within the enclosure 184. The wireless communication module 190 is coupled to antenna 192. The wireless communication module 190 and the antenna 192 are configured to wirelessly receive signals (e.g. control signals) from the wireless coil adaptor 224 and to transmit signals (e.g., signals having image data) to the wireless coil adaptor 224. The wireless coil 222 also includes a synchronization module 226 disposed within the enclosure 184. The synchronization module 226 is coupled to both the electronics 188 and the wireless module 190.

The wireless coil adaptor 224 is configured to couple to a coil plug receptacle 194 of the MRI system. The coil plug receptacle 194 includes a housing 196 that includes a coil plug receptacle connecter 198. The coil plug receptacle 194 (and the coil plug receptacle connector 198) are configured for receiving and coupling to a plug connector of a wired coil (e.g., wired RF coil). The wireless coil adaptor 224 includes a plug connector 200 (e.g., coil plug mate connector) that is configured to be inserted within the coil plug receptacle connector 198 of the coil plug receptacle 194. The plug connector 200 forms mating connectors with the coil plug receptacle connector 198. The wireless coil adaptor 224 includes a housing 201. A portion of the plug connector 200 may extend from the housing 201 to be inserted within the coil plug receptacle connector 198.

The wireless coil adaptor 224 includes a wireless communication module 202. The wireless communication module 202 is disposed within the housing 201. The wireless communication module 202 is coupled to an antenna 203. The wireless communication module 202 and the antenna 203 are configured to wirelessly transmit signals (e.g. control signals) to the wireless coil 222 and to receive signals (e.g., signals having image data) from the wireless coil 222. The controls signals transmitted by the wireless coil adaptor 224 are received from the MRI system via the mating connection between the wireless coil adaptor 224 and the coil plug receptacle 194. The wireless coil adaptor 224 also includes a synchronization module 228 disposed within the housing 201.

The wireless coil adaptor 224 includes a variety of electronics 204 (e.g., electronic circuits) coupled to the wireless communication module 202. The wireless coil adaptor 224 also includes a digital to analog converter 206. The electronics 204 and the digital analog converter 206 are utilized in processing the signals received from the wireless coil 222. In addition, the electronics 204 and the digital to analog converter 206 are configured to prepare the signals for processing by the MRI system (e.g., at the processing unit 214) for generating reconstructed images. The electronics 204 may include one or more filters, a mixer (e.g., a frequency mixer such as an RF mixer), an amplifier or preamplifier, and/or other electronics. The electronics 204 may also include a demultiplexer (DEMUX) circuit. The demultiplexing extracts the original channels from the multiplexed signal received from the wireless coil 222. The digital to analog converter 206 is configured to convert the signals (e.g., representing the image data) from a digital format to an analog format. The synchronization module 226 is coupled to both the electronics 204 and the wireless module 202.

The configuration of the loop array 186 and the electronics 188 may vary depending on the type of wireless coil 222 and how the wireless coil 222 is activated and controlled. For example, certain wireless coils 222 may utilize multi-control bias (MC Bias) or diode decoupling control in conjunction with a digital signal for controlling switching. In certain embodiments, wireless coils 222 may be actively active (e.g., via an LC diode based circuit activated via a control signal). In certain embodiments, wireless coils may be activated passively (e.g., via LC diode base circuit activated via high power from the system). In certain embodiments, MEMS may be utilized to activate decoupling (e.g., via switching relays). In certain embodiments, gallium arsenide field-effect transistor technology may be utilized in decoupling (e.g. decoupling through using transistor as short or open). In any arrangement of the wireless coil 222, any of these techniques may be implemented via a control signal from the wireless coil adaptor 224 as opposed to power transmitted from the wireless coil adaptor 222. In particular, the wireless coil adaptor 224 is configured to transmit one or more control signals received from the MRI system to the wireless coil 222 to activate the wireless coil 222, to control decoupling of the wireless coil, and/or to control an operation of the wireless coil 222. As depicted in FIG. 4, control signals 228 (e.g., MC BIAS) are communicated between the MRI system (via the coil plug receptacle connector 198 of the coil plug receptacle 194) and the wireless communication module 202 of the wireless coil adaptor 224. The control signals 228 are transmitted from the wireless coil adaptor 224 to the wireless coil 222, where the wireless module 190 communicates the control signals 228 to the loop array 186.

Figure 5:
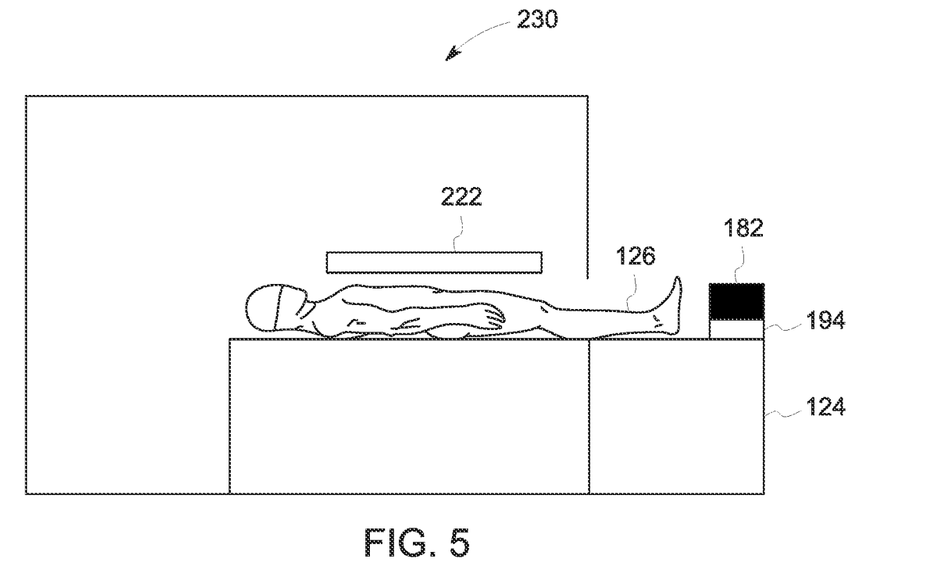
FIG. 5 is a schematic diagram of an MRI system with the wireless coil and the wireless coil adaptor of FIG. 2, in accordance with aspects of the present disclosure.

The MRI system needs to be synchronized with the wireless coil 222. As noted above, both the wireless coil 222 and the wireless coil adaptor 224 include synchronization modules 226 and 228, respectively. The wireless coil adaptor 224 is coupled to the system clock (e.g., high-level system clock) of the MRI system via its connection to the coil plug receptacle 194. The synchronization module 228 in the wireless coil adaptor 224 transmits timing signals to the synchronization module 226 of the wireless coil 222. This enables the respective clocks of the wireless coil 222, wireless coil adaptor 224, and the MRI system to be synched during scans. In certain embodiments, during the scan, the wireless coil 222 could move due to natural movements of the patient (e.g., due to breathing), thus, affecting the synchronization algorithm. Certain techniques (e.g., utilizing pilot tones) may be utilized to accurately synchronize the wireless coil adaptor 224 with the wireless coil 222 by compensating the clock between the wireless coil adaptor 224 and the wireless coil 222. Since both the wireless coil 222 and the wireless coil adaptor 224 include respective communication modules 226, 228, an MRI system 230 (e.g., as depicted in FIG. 5) including the wireless coil 222 and the wireless coil adaptor 224 does not include an additional adaptor (e.g., synchronization adaptor 218 in FIG. 3) coupled to the system clock of the MRI system 230.

Returning to FIG. 4, prior to providing control signals to the wireless coil 222 or receiving data from the wireless coil 222, the wireless coil adaptor 224 needs to detect the wireless coil 222. In certain embodiments, received signal strength algorithms such as used in current wireless communication systems or other algorithms may be utilized. In certain embodiments, a beeping signal transmitted by the wireless coil 222 may be utilized. In certain embodiments, detection may occur automatically upon the wireless coil adaptor 224 being coupled to the coil plug receptacle 194. In certain embodiments, detection may occur upon the wireless coil adaptor 224 receiving a control signal from the MRI system.

Upon detection of the wireless coil 222 by the wireless coil adaptor 224, the wireless coil 222 and the wireless coil adaptor 224 are linked. In certain embodiments, the wireless coil adaptor 224 includes an output device 208 for providing a user-perceptible indication of the connection or linkage between the wireless coil adaptor 224 and the wireless coil 222 as described in greater detail below. The output device 208 may include a light emitting device (e.g., a light emitting diode), a display, and/or a speaker. The output device 208 may also be utilized to provide a user-perceptible indication of the connection between the wireless coil adaptor 224 and the coil plug receptacle 194.

Figure 6:
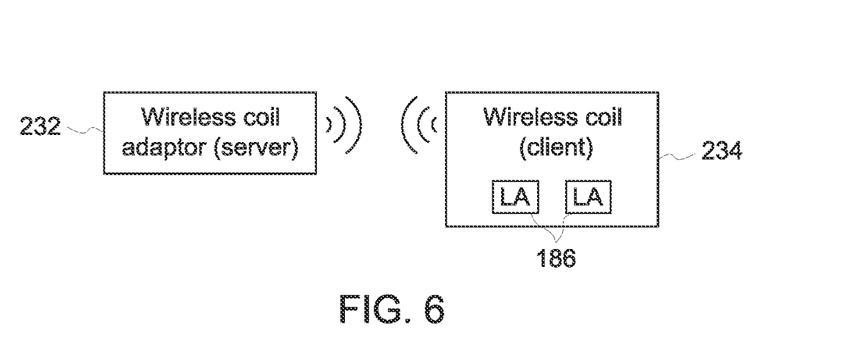
FIG. 6 is a schematic diagram of a server-client relationship between a wireless coil adaptor and a wireless coil (e.g., having multiple loop arrays), in accordance with aspects of the present disclosure.
Figure 7:
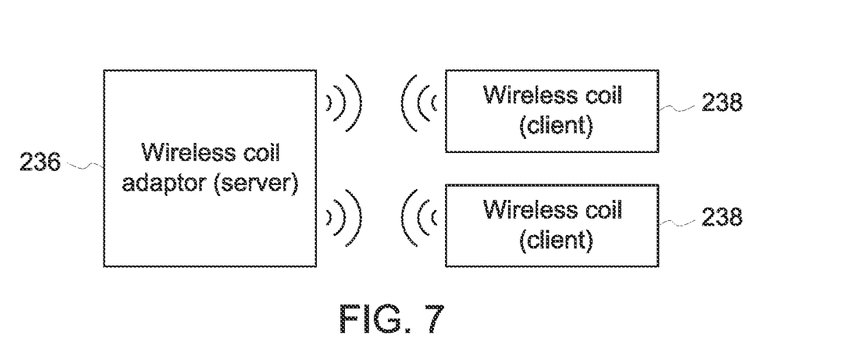
FIG. 7 is a schematic diagram of a server-client relationship between a wireless coil adaptor and multiple wireless coils, in accordance with aspects of the present disclosure.

As depicted in FIG. 4, the wireless communication module 202 of the wireless coil adaptor 224 acts as a server for the wireless coil 222, while the wireless communication module 190 of the wireless coil 222 acts as a client. In certain embodiments, as depicted in FIG. 6, a wireless coil adaptor 232 acts as a server to a wireless coil 234 having multiple loop arrays 186. The wireless coil adaptor 232 and the wireless coil 234 are structurally and functionally similar to the wireless coil adaptor 224 and the wireless coil 222 in FIG. 4. In certain embodiments, each loop array 186 of the wireless coil 234 in FIG. 6 may be coupled to its own electronics, wireless communication module, and/or synchronization module. In certain embodiments, as depicted in FIG. 7, a wireless coil adaptor 236 acts as server to multiple wireless coils 238. Each wireless coil 238 includes a different identification tag. The wireless coil adaptor 236 and the wireless coil 234 are structurally and functionally similar to the wireless coil adaptor 224 and the wireless coil 222 in FIG. 4.

As noted above, the wireless coil adaptor may include an output device to provide a user-perceptible indication of the connection or linkage between the wireless coil adaptor and the wireless coil. The output device may also be utilized to provide a user-perceptible indication of the connection between the wireless coil adaptor and the coil plug receptacle. FIGS. 8-11 provide different embodiments of output devices for a wireless coil adaptor. The wireless coil adaptors in FIGS. 8-11 are structurally and functionally as described above.

Figure 8:
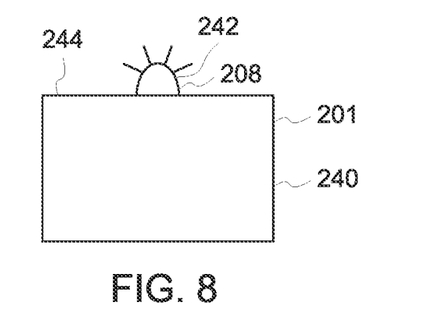
FIG. 8 is a schematic diagram of a wireless coil adaptor (e.g., having a light emitting device), in accordance with aspects of the present disclosure.

FIG. 8 is a schematic diagram of a wireless coil adaptor 240 having a light emitting device 242 as the output device 208. The light emitting device 242 is disposed on a surface 244 of the housing 201 of the wireless coil adaptor 240. In certain embodiments, the light emitting device 242 may be a light emitting diode. In certain embodiments, the light emitting device 242 may emit light of a certain color (e.g., blue) upon the wireless coil adaptor 240 being coupled to the coil plug receptacle of an MRI system. Upon connection, the light may be emitted continuously or periodically (e.g., in a flashing manner). In certain embodiments, the light may be emitted for a brief period of time (e.g., 10 seconds). In certain embodiments, the light emitting device 242 may emit light of another color (e.g., yellow) when the wireless coil adaptor 240 is attempting to detect a wireless coil to link or connect with. The light emitting device 242 may emit light of a different color (e.g., red) when the wireless coil adaptor 242 is linked with a wireless coil. In certain embodiments, the light emitting device 242 may emit the light as the same color during both detecting a wireless coil and linking with the wireless coil but instead alter the pattern of how the light is emitted. For example, when attempting to detect a wireless coil the light may be emitted in a flashing pattern. When a linkage is established with the wireless coil the light may be emitted continuously from the light emitting device 242.

Figure 9:
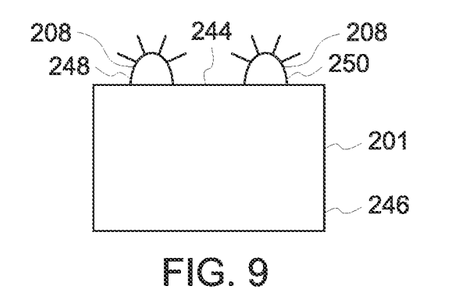
FIG. 9 is a schematic diagram of a wireless coil adaptor (e.g., having multiple light emitting devices), in accordance with aspects of the present disclosure.

FIG. 9 is a schematic diagram of a wireless coil adaptor 246 having multiple light emitting devices 248, 250 as the output device 208. The light emitting devices 248, 250 are disposed on the surface 244 of the housing 201 of the wireless coil adaptor 246. In certain embodiments, the light emitting devices 248, 250 may be light emitting diodes. In certain embodiments, one of the light emitting devices 248, 250 (e.g., light emitting device 248) may be utilized for emitting light when the wireless coil adaptor 246 is coupled to the coil receptacle of an MRI system. In certain embodiments, the light emitting device 248 may emit light of a certain color (e.g., blue) upon the wireless coil adaptor 246 being coupled to the coil plug receptacle of an MRI system. Upon connection, the light may be emitted continuously or periodically (e.g., in a flashing manner). In certain embodiments, the light may be emitted for a brief period of time (e.g., 10 seconds). The other light emitting device 248, 250 (e.g., light emitting device 250) emit light of another color (e.g., yellow) when the wireless coil adaptor 246 is attempting to detect a wireless coil to link or connect with. The light emitting device 250 may emit light of a different color (e.g., red) when the wireless coil adaptor 246 is linked with a wireless coil. In certain embodiments, the light emitting device 250 may emit the light as the same color during both detecting a wireless coil and linking with the wireless coil but instead alter the pattern of how the light is emitted. For example, when attempting to detect a wireless coil the light may be emitted in a flashing pattern. When a linkage is established with the wireless coil the light may be emitted continuously from the light emitting device 250.

Figure 10:
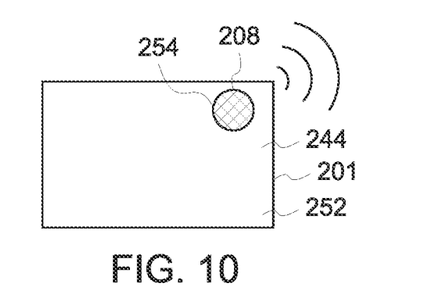
FIG. 10 is a schematic diagram of a wireless coil adaptor (e.g., having a speaker), in accordance with aspects of the present disclosure.

FIG. 10 is a schematic diagram of a wireless coil adaptor 252 having a speaker 254 as the output device 208. The speaker 254 is disposed on the surface 244 of the housing 201. The speaker 254 may emit a message (e.g., "adaptor is coupled to the system") upon the wireless coil adaptor 252 being coupled to the coil plug receptacle of an MRI system. Alternatively, the speaker 254 may emit a single beep or series of beeps upon the wireless coil adaptor 252 being coupled to the coil plug receptacle of the MRI system before going silent. In certain embodiments, the speaker 254 may emit a message (e.g., "attempting to detect wireless coil") when the wireless coil adaptor 252 is attempting to detect a wireless coil to link or connect with. The speaker 254 may emit another message (e.g., "adaptor linked to wireless coil" or "linkage completed") when the wireless coil adaptor 252 is linked with a wireless coil. Alternatively, the speaker 254 may continuously emit beeps while attempting to detect a wireless coil and cease emitting beeps upon establishing a linkage between a wireless coil and the wireless coil adaptor 252.

Figure 11:
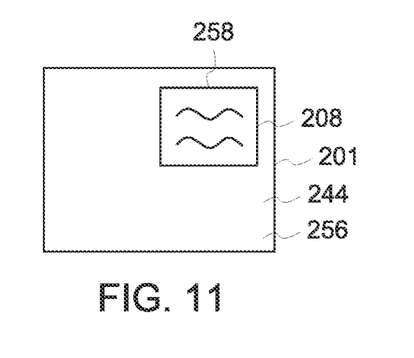
FIG. 11 is a schematic diagram of wireless coil adaptor (e.g., having a display), in accordance with aspects of the present disclosure.

FIG. 11 is a schematic diagram of a wireless coil adaptor 256 having a display 258 as the output device 208. The display 258 is disposed on the surface 244 of the housing 201. The display 258 may display a message (e.g., "adaptor is coupled to the system") upon the wireless coil adaptor 256 being coupled to the coil plug receptacle of an MRI system. Alternatively, the display 258 may display a graphical indicator upon the wireless coil adaptor 256 being coupled to the coil plug receptacle of the MRI system. In certain embodiments, the display 258 may display a message (e.g., "attempting to detect wireless coil") when the wireless coil adaptor 256 is attempting to detect a wireless coil to link or connect with. The display 258 may emit another message (e.g., "adaptor linked to wireless coil" or "linkage completed") when the wireless coil adaptor 256 is linked with a wireless coil. Alternatively, the display 258 display a specific icon when the wireless coil adaptor 256 is attempting to detect a wireless coil to or connect with and display a different icon upon establishing a linkage between a wireless coil and the wireless coil adaptor 256.

Figure 12:
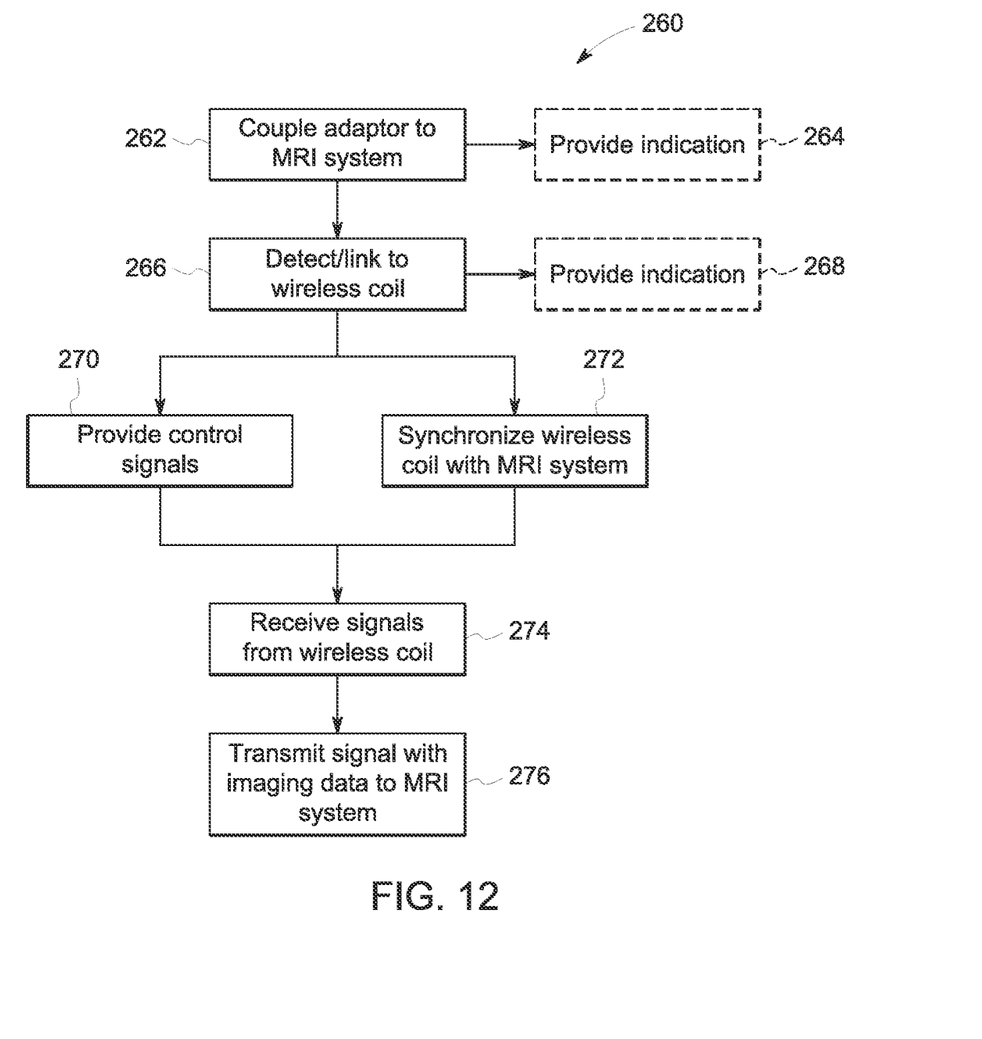
FIG. 12 is a flow chart of a method for utilizing a wireless coil with an MRI system configured for utilizing a wired coil, in accordance with aspects of the present disclosure.

FIG. 12 is a flow chart of a method 260 for utilizing a wireless coil (e.g., wireless RF receiving coil) with an MRI system configured for utilizing a wired coil (e.g., wired RF receiving coil). The steps of the method 260 are performed by the wireless coil adaptor described above. One or more of the steps of the method 260 may be performed simultaneously or in a different order from that depicted in FIG. 12. The method 260 includes coupling the wireless coil adaptor to an MRI system (block 262). In particular, a plug connector of the wireless coil adaptor may be coupled to (e.g., inserted within) a receptacle connector of a coil plug receptacle of the MRI system. The receptacle connector and the coil plug receptacle are configured to receive a plug connector of a wired coil. In certain embodiments, the method 260 also includes providing a user-perceptible indication via an output device of the wireless coil adaptor when the wireless coil adaptor is coupled to the coil plug receptacle (block 264). As described above, the output device may be a light emitting device, a speaker, and/or a display. The indication may be provided as described in FIGS. 8-11.

The method 260 further includes wirelessly detecting and linking a wireless coil to the wireless coil adaptor (block 266). In certain embodiments, detecting a wireless coil may occur upon the wireless coil adaptor being coupled to the MRI system (i.e., coupled to the coil plug receptacle). In certain embodiments, detecting a wireless coil may occur upon the wireless coil adaptor (when coupled to the MRI system) receiving control signals from the MRI system. In certain embodiments, the method 260 includes providing one or more user-perceptible indications via an output device when the wireless coil adaptor detects a wireless coil and/or when the wireless coil adaptor is linked to the wireless coil (block 268). As described above, the output device may be a light emitting device, a speaker, and/or a display. The one or more indications may be provided as described in FIGS. 8-11.

The method 260 even further includes wirelessly providing one or more control signals from the wireless coil adaptor to the wireless coil (block 270). The one or more control signals may be for activating the wireless coil, for controlling decoupling of the wireless coil, and/or for controlling switching of the wireless coil. The control signals are received by the wireless coil adaptor from the MRI system and wirelessly transmitted to the wireless coil. Depending on the type of control signal, the control signals may be provided prior to, during, or after an imaging scan.

The method 260 still further includes wirelessly synchronizing the wireless coil with the MRI system (block 272). The synchronization may occur via the wireless coil adaptor (e.g., via synchronization modules of the wireless coil and the wireless coil adaptor). In certain embodiments, an additional adaptor (e.g., synchronization adaptor) coupled to a system clock of the MRI system may be utilized for synchronization. The synchronization may occur prior to or during an imaging scan. In certain embodiments, provision of control signals (block 270) and synchronization (block 272) may occur at the same time. In certain embodiments, synchronization (block 272) may occur prior to the provision of control signals (block 270). In certain embodiments, provision of control signals (block 270) may begin prior to synchronization (block 272).

The method 260 yet further includes wirelessly receiving, at the wireless coil adaptor, signals representative of imaging data acquired during the imaging scan from the wireless coil at (block 274). The method 260 also includes transmitting the signals (after processing of the signals received from the wireless coil) with the imaging data to MRI system for reconstructing an image (block 276).

Technical effects of the disclosed embodiments include providing a wireless coil adaptor that enables a wireless coil (e.g., wireless RF receiving coil) to be utilized with an MRI system configured to utilize a wired coil. The wireless coil adaptor enables MRI systems configured for wired coils to be utilized with wireless coils without having to upgrade or replace the MRI systems, which avoids high costs and delays. In addition, due to a lack cables coupled to a coil, the setup time during an imaging scan is reduced. Further, the lack of cables coupled to a coil provides additional flexibility in positioning the coil about the patient. Even further, the lack of cables avoids the risk of RF heating on the cables.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

This written description uses examples to disclose the present subject matter, including the best mode, and also to enable any person skilled in the art to practice the invention, including making and using any devices or systems and performing any incorporated methods. The patentable scope of the subject matter is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A wireless coil adaptor, comprising:
    a first plug connector configured to be inserted within a receptacle connector of a magnetic resonance imaging (MRI) system, the receptacle connector being configured for receiving a second plug connector of a wired radio frequency (RF) coil, and wherein the receptacle connector is located on a table that moves a subject in and out of an MR scanner of the MRI system; and
    a wireless communication module configured to wirelessly communicate with a wireless RF coil.

2. The wireless coil adaptor of claim 1, wherein the wireless coil adaptor is configured to transmit one or more control signals via the wireless communication module to the wireless RF coil to control an operation of the wireless RF coil.

3. The wireless coil adaptor of claim 2, wherein the wireless coil adaptor is configured to transmit the one or more control signals via the wireless communication module to the wireless RF coil to activate the wireless RF coil, to control decoupling of the wireless RF coil, and/or to control switching of the wireless RF coil.

4. The wireless coil adaptor of claim 1, wherein the wireless RF coil comprises a receiving coil.

5. The wireless coil adaptor of claim 1, wherein the wireless coil adaptor is configured to receive imaging data from the wireless RF coil and to transmit the imaging data to the MRI system.

6. The wireless coil adaptor of claim 5, comprising a digital to analog converter to convert digital imaging data received from the wireless RF coil to analog imaging data for transmission to the MRI system.

7. The wireless coil adaptor of claim 5, comprising a demultiplexer to demultiplex multiplexed imaging data received from the wireless RF coil.

8. The wireless coil adaptor of claim 1, comprising a synchronization module configured to communicate with the wireless RF coil to synchronize the MRI system with the wireless RF coil.

9. The wireless coil adaptor of claim 1, wherein the wireless coil adaptor is configured to act as a server for a plurality of wireless RF coils having different identification tags.

10. The wireless coil adaptor of claim 1, wherein the wireless coil adaptor is configured to act as server for a plurality of loop arrays for the wireless RF coil.

11. The wireless coil adaptor of claim 1, comprising an output device to indicate when the wireless RF coil is linked with the wireless coil adaptor.

12. The wireless coil adaptor of claim 11, wherein the output device comprises a light emitting diode to emit light or a change a color of the emitted light to indicate when the wireless RF coil is linked with the wireless coil adaptor.

13. A method for utilizing a wireless radio frequency (RF) coil with a magnetic resonance imaging (MRI) system configured for utilizing a wired RF coil, comprising:
    coupling a wireless coil adaptor to the MRI system, wherein coupling the wireless coil adaptor to the MRI system comprises inserting a first plug connector of the wireless coil adaptor within a receptacle connector of the MRI system, the receptacle connector being configured for receiving a second plug connector of the wired RF coil, and wherein the receptacle connector is located on a table that moves a subject in and out of an MR scanner of the MRI system;
    wirelessly linking the wireless coil adaptor to the wireless RF coil;
    wirelessly receiving from the wireless RF coil at the wireless coil adaptor imaging data acquired during an imaging scan; and
    transmitting the imaging data from the wireless coil adaptor to the MRI system.

14. The method of claim 13, comprising wirelessly synchronizing the wireless RF coil with the MRI system via the wireless coil adaptor.

15. The method of claim 14, wherein wirelessly synchronizing the wireless RF coil with the MRI system occurs via a synchronization module disposed within the wireless coil adaptor.

16. The method of claim 14, wherein wirelessly synchronizing the wireless RF coil with the MRI system occurs via a synchronization module disposed within an additional adaptor coupled to a system clock of the MRI system.

17. The method of claim 13, wirelessly providing one or more control signals from the wireless coil adaptor to the wireless RF coil to activate the wireless RF coil, to control decoupling of the wireless RF coil, and/or to control switching of the wireless RF coil.

18. The method of claim 13, comprising providing a user-perceptible indication via an output device of the wireless coil adaptor when the wireless coil adaptor is linked to the wireless RF coil.

19. A magnetic resonance imaging (MRI) system, comprising:
    a wireless radio frequency (RF) coil; and
    a wireless coil adaptor, comprising:
        a first plug connector configured to be inserted within a receptacle connector of the MRI system, the receptacle connector being configured for receiving a second plug connector of a wired RF coil, and wherein the receptacle connector is located on a table that moves a subject in and out of an MR scanner of the MRI system; and
        a wireless communication module configured to wirelessly communicate with the wireless RF coil and to receive imaging data from an imaging scan from the wireless RF coil;
    wherein the wireless coil adaptor is configured to transmit the imaging data to the MRI system.

* * * * *